(12) United States Patent
Kim et al.

(10) Patent No.: US 7,955,960 B2
(45) Date of Patent: Jun. 7, 2011

(54) NONVOLATILE MEMORY DEVICE AND METHOD OF FABRICATING THE SAME

(75) Inventors: Se Jun Kim, Changwon-si (KR); Eun Seok Choi, Seongnam-si (KR); Kyoung Hwan Park, Seoul (KR); Hyun Seung Yoo, Icheon-si (KR); Myung Shik Lee, Seoul (KR); Young Ok Hong, Icheon-si (KR); Jung Ryul Ahn, Seoul (KR); Yong Top Kim, Seoul (KR); Kyung Pil Hwang, Seoul (KR); Won Sic Woo, Guri-si (KR); Jae Young Park, Icheon-si (KR); Ki Hong Lee, Suwon-si (KR); Ki Seon Park, Yongin-si (KR); Moon Sig Joo, Icheon-si (KR)

(73) Assignee: Hynix Semiconductor Inc., Icheon-si, Kyounki-do (KR)

( * ) Notice: Subject to any disclaimer, the term of this patent is extended or adjusted under 35 U.S.C. 154(b) by 143 days.

(21) Appl. No.: 12/052,914

(22) Filed: Mar. 21, 2008

(65) Prior Publication Data

US 2008/0230830 A1    Sep. 25, 2008

(30) Foreign Application Priority Data

| Mar. 22, 2007 | (KR) | ......................... 10-2007-0028001 |
| May 3, 2007 | (KR) | ......................... 10-2007-0042979 |
| Jun. 27, 2007 | (KR) | ......................... 10-2007-0063605 |
| Sep. 10, 2007 | (KR) | ......................... 10-2007-0091555 |

(51) Int. Cl.
  *H01L 21/336* (2006.01)

(52) U.S. Cl. ................... 438/496; 438/426; 257/E21.54; 257/E21.645; 257/E21.66

(58) Field of Classification Search ................. 438/296, 438/424, 426, 294, FOR. 123, FOR. 221; 257/E21.54, E21.645, E21.66
See application file for complete search history.

(56) References Cited

U.S. PATENT DOCUMENTS 5,930,645 A * 7/1999 Lyons et al. .................. 438/424
(Continued)

FOREIGN PATENT DOCUMENTS

JP  2000-306989  11/2000
(Continued)

OTHER PUBLICATIONS

Office Action dated Nov. 27, 2009, for Korean application No. 10-2007-0063605.

(Continued)

*Primary Examiner* — Matthew S Smith
*Assistant Examiner* — Quovaunda Jefferson
(74) *Attorney, Agent, or Firm* — Lowe Hauptman Ham & Berner LLP

(57) ABSTRACT

A nonvolatile memory device and a method of fabricating the same is provided to prevent charges stored in a charge trap layer from moving to neighboring memory cells. The method of fabricating a nonvolatile memory device, includes forming a first dielectric layer on a semiconductor substrate in which active regions are defined by isolation layers, forming a charge trap layer on the first dielectric layer, removing the first dielectric layer and the charge trap layer over the isolation layers, forming a second dielectric layer on the isolation layers including the charge trap layer, and forming a conductive layer on the second dielectric layer.

22 Claims, 6 Drawing Sheets

U.S. PATENT DOCUMENTS

| | | | |
|---|---|---|---|
| 6,063,666 A * | 5/2000 | Chang et al. | 438/261 |
| 6,215,702 B1 * | 4/2001 | Derhacobian et al. | 365/185.29 |
| 6,404,020 B1 * | 6/2002 | Kim | 257/374 |
| 6,417,053 B1 * | 7/2002 | Kuo | 438/287 |
| 6,867,463 B2 * | 3/2005 | Chang | 257/391 |
| 2003/0119256 A1 * | 6/2003 | Dong et al. | 438/257 |
| 2003/0122204 A1 * | 7/2003 | Nomoto et al. | 257/406 |
| 2005/0093047 A1 * | 5/2005 | Goda et al. | 257/300 |
| 2006/0134845 A1 | 6/2006 | Pham et al. | |
| 2006/0148199 A1 * | 7/2006 | Kim | 438/424 |

FOREIGN PATENT DOCUMENTS

| | | |
|---|---|---|
| KR | 1020020048261 | 6/2002 |
| KR | 1020020073960 | 9/2002 |
| KR | 1020030008990 | 1/2003 |
| KR | 10-2005-0066879 | 6/2005 |
| KR | 1020060083509 | 7/2006 |
| KR | 1020060135221 | 12/2006 |
| KR | 1020070002744 | 1/2007 |
| KR | 100771808 | 10/2007 |

OTHER PUBLICATIONS

Korean Notice of Allowance for Korean application No. 10-2007-0028001, Date: May 31, 2010.

Korean Notice of Allowance for Korean application No. 10-2007-0063605, Date May 31, 2010.

Korean Office Action for Korean application No. 10-2007-0091555, Date May 26, 2010.

* cited by examiner

NONVOLATILE MEMORY DEVICE AND METHOD OF FABRICATING THE SAME

CROSS-REFERENCES TO RELATED APPLICATIONS

The present application claims priority to Korean patent application number 2007-28001, filed on Mar. 22, 2007, Korean patent application number 2007-42979, filed on May 3, 2007, Korean patent application number 2007-63605, filed on Jun. 27, 2007, and Korean patent application number 2007-91555, filed on Sep. 10, 2007, which are incorporated by reference in its entirety.

BACKGROUND OF THE INVENTION

The present invention relates to a nonvolatile memory device and method of fabricating the same.

In general, a memory cell of a nonvolatile memory device in which data is stored has a stacked gate structure. This stacked gate structure is formed by sequentially stacking a tunnel dielectric layer, a floating gate, an inter-gate dielectric layer, a control gate and a gate electrode layer over a channel region of the memory cell. The floating gate is used as a charge trap layer and is generally formed of a conductive layer such as polysilicon.

Meanwhile, a nonvolatile memory device using a non-conductive layer (for example, a nitride layer) as the charge trap layer instead of polysilicon has been proposed. The nonvolatile memory device using the non-conductive layer as the charge trap layer, as described above, can be classified into a SONOS (Silicon/Oxide/Nitride/Oxide/Silicon) nonvolatile memory device, a MANOS (Metal/$Al_2O_3$/Nitride/Oxide/Silicon) nonvolatile memory device, and so on depending on the material of a gate electrode layer, etc. This nonvolatile memory device has a tunnel dielectric layer forming a direct tunneling layer, a nitride layer for storing charges, an insulating layer used as a blocking layer, and a control gate electrode.

In the nonvolatile memory device using a conductive layer, such as polysilicon, as the charge trap layer, there is a problem that a retention time reduces significantly if any micro defect exists in the floating gate. However, in the nonvolatile memory device using a non-conductive layer, such as a nitride layer, as the charge trap layer, there is an advantage in that sensitivity to defects in process is relatively small due to the characteristic of the nitride layer.

Further, in the nonvolatile memory device using the conductive layer as the charge trap layer, there are limitations to the implementation of a low-voltage operation and a high-speed operation because the tunnel dielectric layer of about 70 angstroms or more in thickness is formed under the floating gate. However, in the nonvolatile memory device using the non-conductive layer as the charge trap layer, a memory device having a high-speed operation while requiring low voltage and low power can be implemented because a relatively thin direct tunneling dielectric layer is formed under the nitride layer.

In fabricating nonvolatile memory devices using the non-conductive layer as the charge trap layer, in general, isolation layers are formed in a semiconductor substrate through a STI (Shallow Trench Isolation) scheme, and a gate oxide layer, a nitride layer for storing charges, an oxide layer used as a blocking layer, a gate electrode layer, and so on are formed over the semiconductor substrate including the isolation layers. A gate pattern process is then performed to thereby form a gate constituting a memory cell.

However, if a flash memory device using this non-conductive layer as the charge trap layer is fabricated, the nitride layers for storing charges are not formed in respective memory cells separately, but are interconnected in the direction of the memory cells even after the gate pattern process is carried out. In this case, charges trapped in the charge trap layer included in a specific memory cell can diffuse into neighboring memory cells in a horizontal direction as time goes by.

FIG. 1 is a sectional view illustrating a conventional method of fabricating a MANOS type nonvolatile memory device.

Referring to FIG. 1, a semiconductor substrate 10 is etched to thereby form trenches. The trenches are gap-filled with an insulating layer, forming isolation layers 11. A tunnel dielectric layer 12 is then formed over an active region of the semiconductor device. A charge trap layer 13, a blocking insulating layer 14, a metal electrode layer 15, and gate electrode layers 16, 17 are sequentially formed over the entire surface. A gate pattern etch process is then performed to thereby form a gate of a cell region.

In the conventional MANOS type nonvolatile memory device, the charge trap layer 13 is also formed on an isolation region between active regions. Thus, if baking is performed at high temperature after programming is carried out by trapping charges in the charge trap layer 13, the trapped charges move to neighboring gates, which may lower a program threshold voltage. It leads to a degraded retention characteristic (i.e., the charge retention capability of a cell).

FIG. 2 is a sectional view illustrating a conventional method of fabricating a SONOS type nonvolatile memory device.

Referring to FIG. 2, an isolation region of a semiconductor substrate 20 is etched to thereby form isolation trenches. The trenches are gap-filled with an insulating layer, forming isolation layers 21. A tunnel dielectric layer 22, a charge trap layer 23, a blocking layer 24, a conductive layer 25 for a control gate, and a gate electrode layer 26 are sequentially stacked over the entire surface including the isolation layers 21.

In the conventional SONOS type nonvolatile memory device, a low voltage transistor and a high voltage transistor are first formed in a peri region (i.e., a peripheral region), and a cell to be used as a storage medium is then formed. In accordance with the above method, the charge trap layer of the cell region is shared with neighboring cells in the word line direction. Due to this, a problem may arise because trapped charges may move to neighboring gates, thereby lowering the program threshold voltage of a cell. It leads to a degraded retention characteristic (i.e., the charge retention capability of a cell).

Further, the charge trapping efficiency of the charge trap layer is about 70% compared with that of the floating gate because not all the charges passing through the tunnel dielectric layer are trapped, but only part of them are trapped. In this case, the threshold voltage corresponding to such short efficiency must be compensated for by increasing a program bias, but it is very difficult to form a high voltage transistor for transferring a high voltage.

BRIEF SUMMARY OF THE INVENTION

The present invention is directed to preventing charges, which are stored in a charge trap layer, from diffusing into neighboring memory cells by performing a patterning process on the charge trap layer in order to form the charge trap layer only in each memory cell.

Further, the present invention is directed towards a method of fabricating a nonvolatile memory device, which can improve the program threshold voltage and thereby the retention characteristic of a cell, by forming charge trap layers in spaces between isolation layers formed in isolation regions of a semiconductor substrate in order to prevent charges, which are trapped in the charge trap layers, from moving to neighboring cell gates at the time of a program operation.

Furthermore, the present invention is directed towards a method of fabricating a nonvolatile memory device, which can prevent charges, which are trapped in a charge trap layer, from moving to neighboring cell gates at the time of a program operation and, thereby improve the program threshold voltage and retention characteristic of a cell, by forming the charge trap layer over a semiconductor substrate and then forming isolation layers through a subsequent process in order to electrically isolate charge trap layers of memory cells from those of other memory cells adjacent in the direction of bit lines through the isolation layers.

In accordance with an aspect of the present invention, there is provided a method of fabricating a nonvolatile memory device, including forming a first dielectric layer on a semiconductor substrate in which active regions are defined by isolation layers, forming a charge trap layer on the first dielectric layer, removing the first dielectric layer and the charge trap layer over the isolation layers, forming a second dielectric layer on the isolation layers including the charge trap layer, and forming a conductive layer on the second dielectric layer.

The charge trap layer may be formed on the active regions and at edge portions of the isolation layers.

The charge trap layer may be formed only on the active regions. The formation of the isolation layers in the semiconductor substrate may include forming a pad nitride layer on the semiconductor substrate, forming first mask patterns on the pad nitride layer having open regions corresponding to the isolation layers, patterning the pad nitride layer using the first mask patterns and forming trenches in the semiconductor substrate, and gap-filling the trenches with an insulating material, thus forming the isolation layers. When the charge trap layer and the first dielectric layer are patterned, second mask patterns having open regions may be formed on the charge trap layer. The first mask patterns may have open regions identical to or wider than those of the second mask patterns.

The charge trap layer may be formed of insulating material such as a nitride layer.

In accordance with another aspect of the present invention, there is provided a nonvolatile memory device, including a semiconductor substrate in which active regions are defined by isolation layers, first dielectric layers isolated from each other and formed in the active regions, respectively, a charge trap layer formed of insulating material and formed only on the first dielectric layer, a second dielectric layer formed on the semiconductor substrate and the charge trap layer, and a conductive layer formed on the second dielectric layer.

The first dielectric layer may be partially formed on the isolation layers.

In accordance with still another aspect of the present invention, there is provided a method of fabricating a nonvolatile memory device, including forming an insulating layer and a hard mask layer over a semiconductor substrate, forming trenches by etching an isolation region of the semiconductor substrate through an etch process employing the hard mask layer and gap-filling the trenches with an insulating layer, thus forming isolation layers, forming a passivation dielectric layer on the insulating layer for the hard mask including the isolation layers, etching and removing the passivation dielectric layer, the hard mask layer and the insulating layer thereby forming protruded isolation layers, sequentially stacking a tunnel dielectric layer, a charge trap layer and a buffer dielectric layer on the entire surface of the semiconductor substrate including the isolation layers, and performing a polishing process to expose a top surface of the protruded isolation layers, so the tunnel dielectric layer and the charge trap layer remain on active regions of the semiconductor substrate.

After the polishing process, a blocking insulating layer, a metal layer and a gate electrode layer on the entire surface including the isolation layers may be sequentially stacked.

The passivation dielectric layer may be formed of a nitride layer of 200 to 4000 angstroms in thickness using a LP-CVD or PE-CVD method. A protruding height of the isolation layer may be in the range of 200 to 800 angstroms.

The tunnel dielectric layer may be formed by a thermal dry oxidization process, a thermal wet oxidization process or a radical oxidization process. A height of the charge trap layer may be lower than that of a top surface of the isolation layer.

The charge trap layer may be formed of stoichiometric silicon nitride or Si-rich nitride to a thickness of 40 to 200 angstrom by a LP-CVD or PE-CVD method.

The buffer dielectric layer may be formed of HDP (High Density Plasma) oxide, SOG (Spin On Glass), USG (Undoped Silicate Glass, PSG (PhosphoSilicate Glass) or BPSG (BoroPhosphoSilicate Glass) to a thickness of 500 to 4000 angstroms.

In accordance with still another aspect of the present invention, there is provided a method of fabricating a nonvolatile memory device, including a method of fabricating a nonvolatile memory device, including sequentially stacking a first tunnel dielectric layer, a charge trap layer, a blocking insulating layer and a first conductive layer on a semiconductor substrate in which a cell region and a peri region are defined, forming isolation trenches by etching the first conductive layer, the blocking insulating layer, the charge trap layer, the first tunnel dielectric layer and the semiconductor substrate, forming isolation layers by gap-filling the isolation trenches with an insulating layer, and sequentially forming a second conductive layer and a metal gate layer on the entire surface including the first conductive layer.

The method further includes, before the second conductive layer is formed after the isolation layers are formed, forming a passivation dielectric layer in the cell region, removing the first conductive layer, the blocking insulating layer, the charge trap layer and the first tunnel dielectric layer formed in the peri region, controlling a height of the isolation layers by etching a protruding top surface of the isolation layers formed in the peri region, forming a second tunnel dielectric layer for a transistor over the exposed semiconductor substrate of the peri region, and removing the passivation dielectric layer.

The tunnel dielectric layer may be formed of an oxide layer to a thickness of 10 to 100 angstroms. The charge trap layer may have a mixed layer of a nitride layer or an oxide layer and a nitride layer and may be formed to a thickness of 10 to 100 angstroms. The blocking insulating layer may have a dual structure of an oxide layer, a nitride layer or an oxide layer and a nitride layer and may be formed to a thickness of 10 to 500 angstroms. The first and second conductive layers for the control gate may be formed of a polysilicon layer.

After the first conductive layer is formed, an impurity may be further implanted into the charge trap layer by performing an ion implantation process before the isolation trenches are formed. The ion implantation process may be performed using As or P as the impurity.

The passivation dielectric layer may be formed of a nitride layer.

The tunnel dielectric layer for the transistor may be formed to a thickness of 100 to 600 angstroms in the case of a high voltage transistor, and the tunnel dielectric layer for the transistor may be formed to a thickness of 100 to 200 angstroms in the case of a low voltage transistor.

The charge trap layer may have a mixed layer of a nitride layer or an oxide layer and a nitride layer. The charge trap layer may be formed of $HFO_2$, $ZrO_2$, HFAlO, HFSiO, ZrAlO or ZrSiO. After the blocking insulating layer is formed, a RTP (Rapid Thermal Processing) may be performed in order to improve a film quality of the blocking insulating layer.

The first conductive layer and the second conductive layer may be formed of a polysilicon layer or a metal layer. The polysilicon layer may be formed of a polysilicon layer doped with an $N^+$ impurity. The ion doping concentration of the impurity may range from 1E19 atoms/$cm^3$ to 5E20 atoms/$cm^3$. The metal layer may be formed of TaN.

In accordance with further still another aspect of the present invention, there is provided a nonvolatile memory device, including a tunnel dielectric layer, a charge trap layer, a blocking insulating layer and a first conductive layer sequentially stacked on a semiconductor substrate, isolation layers protruding as high as a height of the first conductive layer in isolation regions of the semiconductor substrate and configured to isolate the tunnel dielectric layer, the charge trap layer, the blocking insulating layer and the first conductive layer from a neighboring tunnel dielectric layer, a neighboring charge trap layer, a neighboring blocking insulating layer and a neighboring first conductive layer, and a second conductive layer and a metal gate layer sequentially stacked on the isolation layers and the first conductive layer.

The charge trap layer may be formed of a nitride layer or a mixed layer of an oxide layer and a nitride layer. The charge trap layer may be formed of $HFO_2$, $ZrO_2$, HFAlO, HFSiO, ZrAlO or ZrSiO.

DESCRIPTION OF SPECIFIC EMBODIMENTS

Now, specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the scope of the present invention. The present invention is defined by the category of the claims.

FIGS. 3A to 3F are sectional views illustrating a method of fabricating a nonvolatile memory device in accordance with a first embodiment of the present invention.

Figure 1:
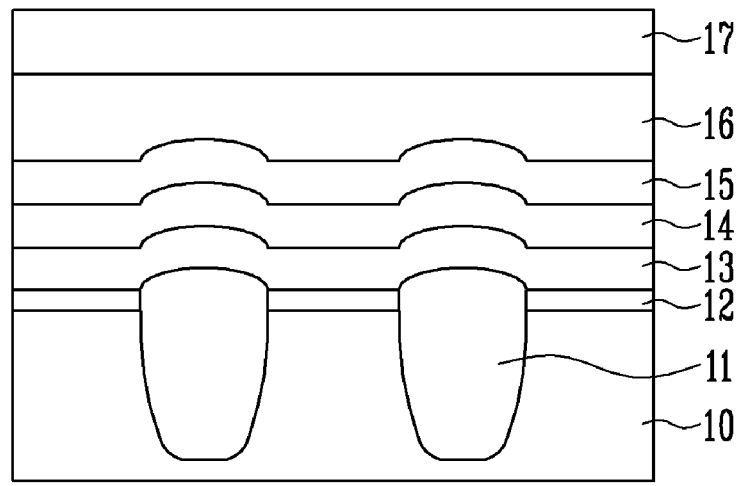
FIG. 1 is a sectional view illustrating a conventional method of fabricating a MANOS type nonvolatile memory device.
Figure 2:
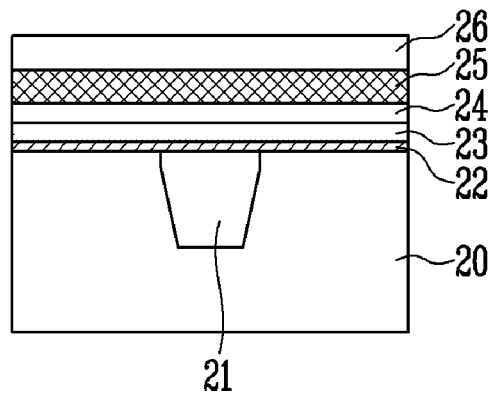
FIG. 2 is a sectional view illustrating a conventional method of fabricating a SONOS type nonvolatile memory device.
Figure 3A:
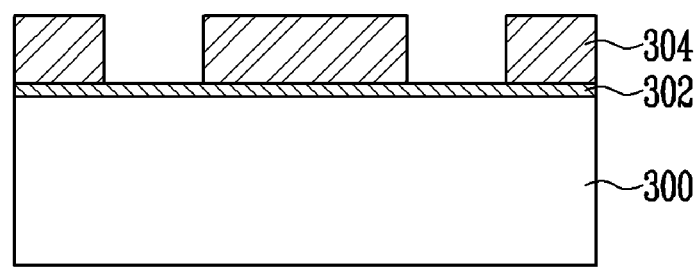
FIGS. 3A to 3F are sectional views illustrating a method of fabricating a nonvolatile memory device in accordance with a first embodiment of the present invention.

Referring to FIG. 3A, a screen oxide layer (not shown) is formed on a semiconductor substrate 300. The screen oxide layer functions to prevent damage to the surface of the semiconductor substrate 300 in subsequent processes such as a well ion implantation process or a threshold voltage ion implantation process. Subsequently, the well ion implantation process is performed so as to form a well region in the semiconductor substrate 300 and the threshold voltage ion implantation process is performed so as to control the threshold voltage of a semiconductor element such as a transistor. The well region (not shown) is formed in the semiconductor substrate 300 and can have a triple structure.

After the screen oxide layer is removed, a pad nitride layer 302 is formed on the semiconductor substrate 300. Then, first mask patterns 304 are formed over the pad nitride layer 302. The first mask patterns 304 have open regions corresponding to trenches which are formed in the semiconductor substrate 300 in a subsequent process. An oxide layer (not shown) having an etch selectivity different from that of the pad nitride layer 302 may be further formed between the pad nitride layer 302 and the first mask patterns 304. The oxide layer (not shown) can function to prevent damage to the surface of the semiconductor substrate 300 in a subsequent etch process.

Figure 3B:
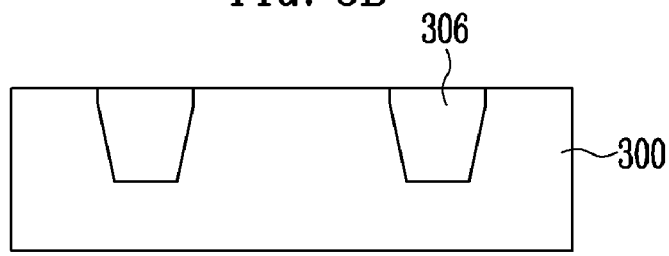

Referring to FIG. 3B, the pad nitride layer 302 (refer to FIG. 3A) is patterned by an etch process employing the first mask patterns 304 (refer to FIG. 3A) as an etch mask. Trenches are then formed in the semiconductor substrate 300. Insulating material is formed on the first mask patterns 304 (refer to FIG. 3A) including the trenches, so the trenches are gap-filled with the insulating material. The insulating material, the first mask patterns 304 (refer to FIG. 3A) and the pad nitride layer 302 (refer to FIG. 3A) formed over the semiconductor substrate 300 are removed by performing a polishing process, such as a CMP (Chemical Mechanical Polishing) process, on the semiconductor substrate 300. Consequently, the insulating material remains only in the trenches formed in the semiconductor substrate 300, thereby forming isolation layers 306. A plurality of active regions (not shown) are also defined by the isolation layers 306 in the semiconductor substrate 300.

Figure 3C:
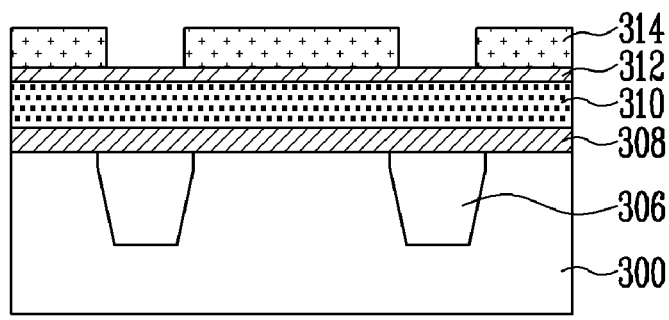

Referring to FIG. 3C, a first dielectric layer 308 is formed on the semiconductor substrate 300 including the isolation layers 306. The first dielectric layer 308 may serve as a tunnel dielectric layer in a nonvolatile memory device using a non-conductive layer as a charge trap layer. A charge trap layer 310 is formed on the first dielectric layer 308, subsequently. The charge trap layer 310 is formed over the entire upper surface of the semiconductor substrate 300 over the plurality of active regions defined by the isolation layers 306. The charge trap layer 310 may be a non-conductive layer such as a nitride layer.

A buffer layer 312 is formed on the charge trap layer 310. The buffer layer 312 can function to prevent damage to the charge trap layer 310 during a subsequent etch process. Second mask patterns 314 are formed on the buffer layer 312, subsequently. The second mask patterns 312 have open regions corresponding to the isolation layers 306 formed in the semiconductor substrate 300. The open regions of the second mask patterns 312 may be much smaller than those of the first mask patterns 304. Meanwhile, although not shown in the drawings, the second mask patterns 314 may be formed in the same manner as the first mask patterns 304 formed in the previous process. In this case, there is an advantage in that a photomask which is used to form the first mask patterns 304 can be used to form the second mask patterns 314 without change.

Figure 3D:
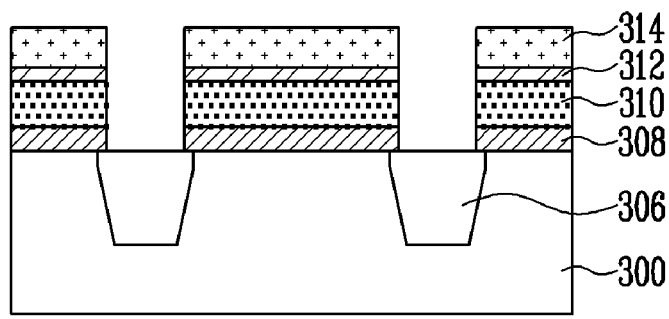

Referring to FIG. 3D, the buffer layer 312, the charge trap layer 310 and the first dielectric layer 308 formed under the second mask patterns 314 are patterned by performing an etch process employing the second mask patterns 314 as an etch mask. Thus, the charge trap layer 310 disposed in the open regions of the second mask patterns 314 is removed. The charge trap layer 310, which was formed to be connected horizontally over the plurality of active regions, is disconnected and isolated on the active region. Here, an edge portion of the charge trap layer 310 is adjusted to a boundary portion of the isolation layer 306. However, if the open region of the second mask pattern 314 is much smaller than that of the first mask pattern 304, the width of the charge trap layer 310 remaining after the etch process employing the second mask patterns 314 is further widened, so that a part of the disconnected charge trap layer 310 may exist on the isolation layers 306. In this case, the amount of charges stored in the charge trap layer 310 can be increased, thereby improving the device characteristics. Meanwhile, if the open regions of the second mask pattern 314 are identical to those of the first mask pattern 304, the charge trap layer 310 may not exist on the isolation layers 306, but may be formed only on the active region.

Conventionally, the charge trap layers 310 are formed horizontally over the plurality of active regions and remain connected in a horizontal direction over a number of memory cells even after a subsequent gate etch process. In this case, charges stored in the charge trap layer 310 included in a specific memory cell may diffuse horizontally as time goes by, thereby causing a shift in the threshold voltage because of a potential difference. This may degrade the data retention characteristic of the memory cell. This problem will emerge as a problem that must be considered seriously as the size of a memory cell gradually decreases.

As described above, in accordance with the present invention, the charge trap layers 310 are isolated from one another so that they are formed only in the active regions, respectively. Thus, the charge trap layers 310 can be isolated from one anther and formed only in respective memory cells formed through a subsequent process. Accordingly, it can reduce the occurrence of problems such as potential drop, a shift in the threshold voltage and degradation of the data retention characteristic, which are generated when charges stored in the charge trap layers 310 move to neighboring memory cells.

Figure 3E:
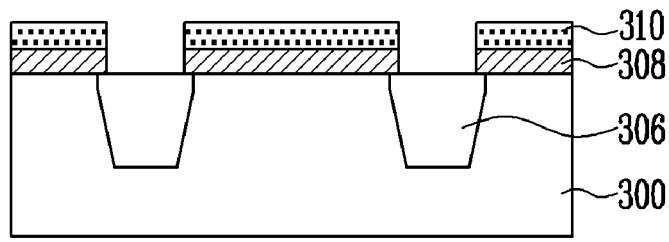

Referring to FIG. 3E, the second mask patterns 314 (refer to FIG. 3D) and the buffer layer 312 (refer to FIG. 3D) formed over the semiconductor substrate 300 are removed.

Figure 3F:
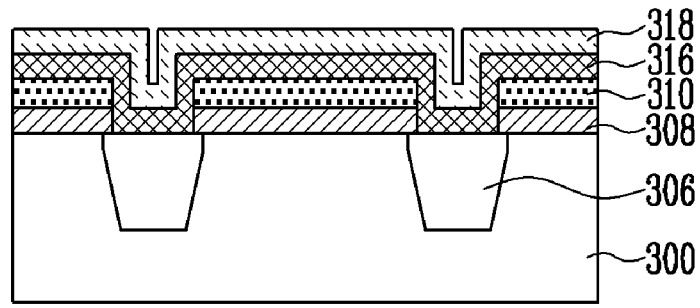

Referring to FIG. 3F, a second dielectric layer 316 is formed over the semiconductor substrate 300 including the isolation layers 306 and the charge trap layers 310. The second dielectric layer 316 can be formed while maintaining a step formed by the first dielectric layer 308 and the charge trap layer 310 stacked over the semiconductor substrate 300. The second dielectric layer 316 may be formed of an oxide layer such as $Al_2O_3$. At this time, charges stored in the charge trap layer 310 cannot move to neighboring charge trap layers 310 due to the energy barrier existing between the charge trap layer 310 and the second dielectric layer 316. A conductive layer 318 is formed on the second dielectric layer 316 subsequently. The conductive layer 318 may be formed of a metal layer. Although not shown in the drawings, the process of forming a memory cell including the charge trap layers 310, which are isolated from one another, is completed by patterning the stacked layers through a gate etch process.

FIGS. 4A to 4G are sectional views illustrating a method of fabricating a nonvolatile memory device in accordance with a second embodiment of the present invention.

Figure 4A:
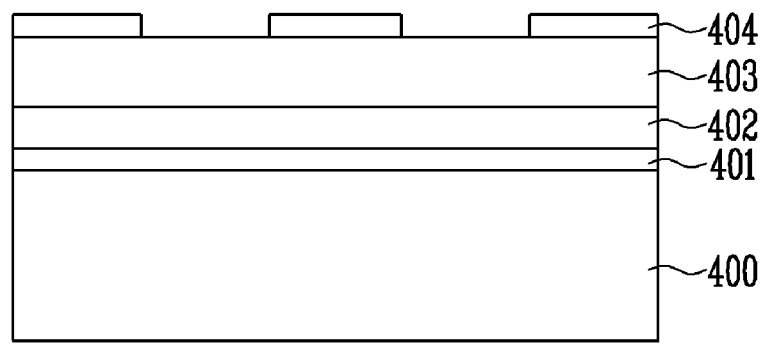
FIGS. 4A to 4G are sectional views illustrating a method of fabricating a nonvolatile memory device in accordance with a second embodiment of the present invention.

Referring to FIG. 4A, a capping dielectric layer 401, an insulating layer 402 for forming isolation layers, and a hard mask layer 403 are sequentially formed over a semiconductor substrate 400. The capping dielectric layer 401 may be formed of an oxide layer. The sum of the thickness of the capping dielectric layer 401, the insulating layer 402 and the hard mask layer 403 may be in the range of 500 to 4000 angstroms. The insulating layer 402 may be formed of a nitride layer. Subsequently, photoresist patterns 404 for forming isolation trenches are formed by exposure and development processes.

Figure 4B:
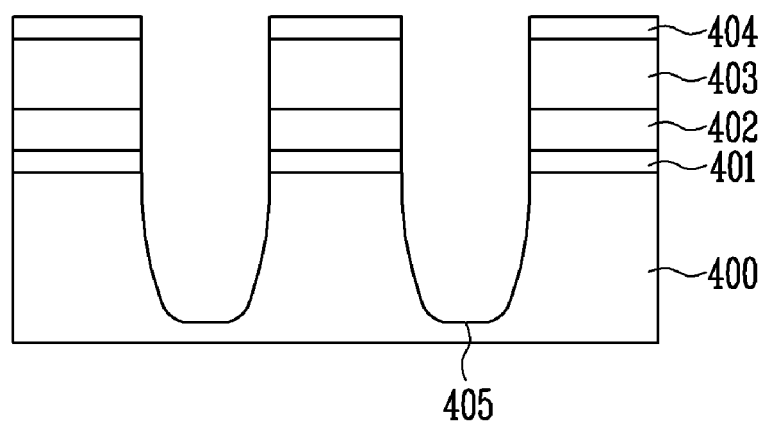

Referring to FIG. 4B, the hard mask layer 403, the insulating layer 402, and the capping dielectric layer 401 are sequentially etched and patterned by an etch process employing the photoresist patterns 404 as an etch mask. The exposed semiconductor substrate 400 is etched to thereby form trenches 405. The trenches 405 may be formed to a depth of 1500 to 2500 angstroms by etching the semiconductor substrate 400.

Figure 4C:
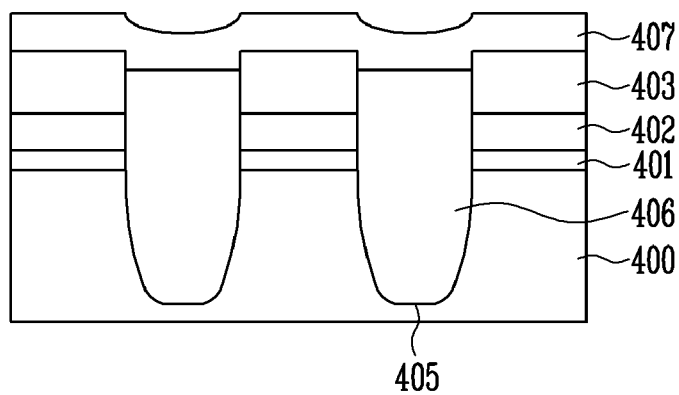

Referring to FIG. 4C, after the photoresist patterns are removed by a strip process, an insulating layer is deposited over the entire surface. A CMP process is then performed so that the hard mask layer 403 is exposed, thus forming isolation layers 406 within the trenches 405. The isolation layers 406 may be formed of an HDP (High Density Plasma) oxide layer, an SOG (Spin On Glass) oxide layer, USG (Undoped Silicate Glass, PSG (PhosphoSilicate Glass) or BPSG (Boro-PhosphoSilicate Glass). A passivation dielectric layer 407 is formed over the entire surface including the isolation layers 406, subsequently. The passivation dielectric layer 407 functions to prevent a top surface of the isolation layers 406 from being lost in a subsequent etch process. The passivation dielectric layer 407 may be formed of a nitride layer to a thickness of 200 to 4000 angstroms using a LP-CVD or PE-CVD method.

Figure 4D:
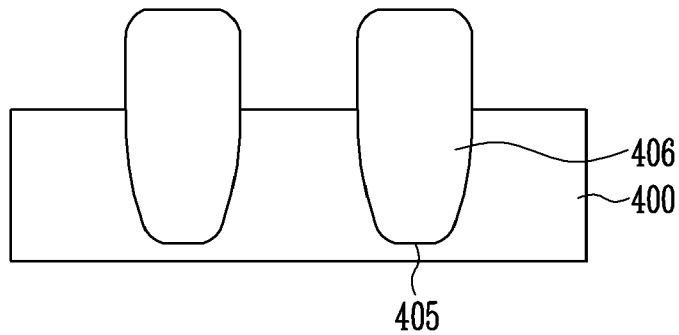

Referring to FIG. 4D, the passivation dielectric layer 407, the hard mask layer 403, the insulating layer 402, and the capping dielectric layer 401, which are formed over the active regions, are sequentially removed by performing an etch process. The isolation layer 406 has a protrusion projecting upwardly from the semiconductor substrate 400. The height of the protrusion may range from 200 to 800 angstroms. Here, the passivation dielectric layer 407, the hard mask layer 403 and the insulating layer 402 may be removed by a wet etch process employing $H_2PO_4$. Alternatively, the passivation dielectric layer 407, the hard mask layer 403 and the insulating layer 402 may be removed by a dry etch process.

Figure 4E:
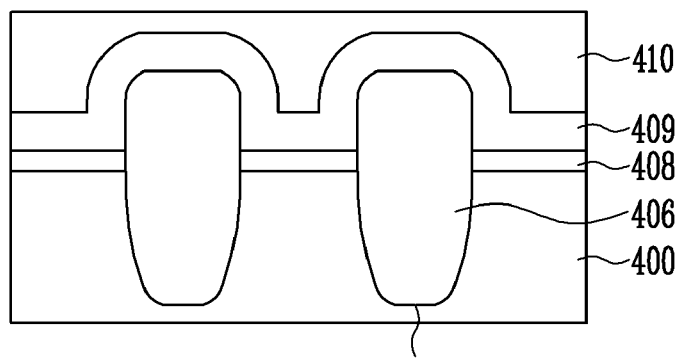

Referring to FIG. 4E, a tunnel dielectric layer 408 is formed on the active regions of the semiconductor substrate 400. That is, the tunnel dielectric layer 408 is formed in regions between the isolation layers 406. The tunnel dielectric layer 408 may be formed by a thermal dry oxidization process, a thermal wet oxidization process or a radical oxidization process. A charge trap layer 409 is then formed over the entire surface including the tunnel dielectric layer 408. Here, the thickness of the charge trap layer 409 formed on the active region can be lower than that of the charge trap layer 409 formed on a top surface of the isolation layers 406. The charge trap layer 409 may be formed to a thickness of 40 to 200 angstroms by a LP-CVD or PE-CVD method. The charge trap layer 409 may be formed of stoichiometric silicon nitride or Si-rich nitride. A buffer dielectric layer 410 is then formed over the entire surface. The buffer dielectric layer 410 may be formed of HDP oxide, SOG, USG, PSG or BPSG to a thickness of 500 to 4000 angstroms.

Figure 4F:
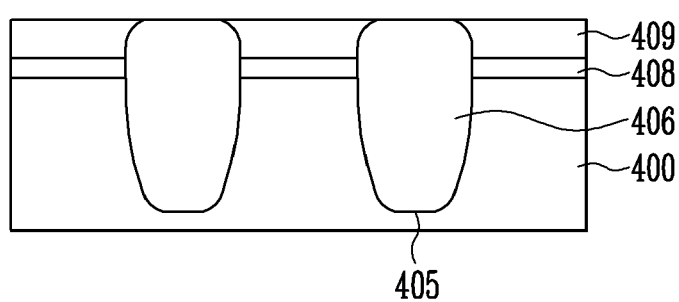

Referring to FIG. 4F, a CMP process is performed until the top surface of the isolation layer 406 is exposed. Thus, the charge trap layer 409 formed on the top surface of the isolation layer 406 is removed so that the charge trap layer 409 remains only on the active regions.

Figure 4G:
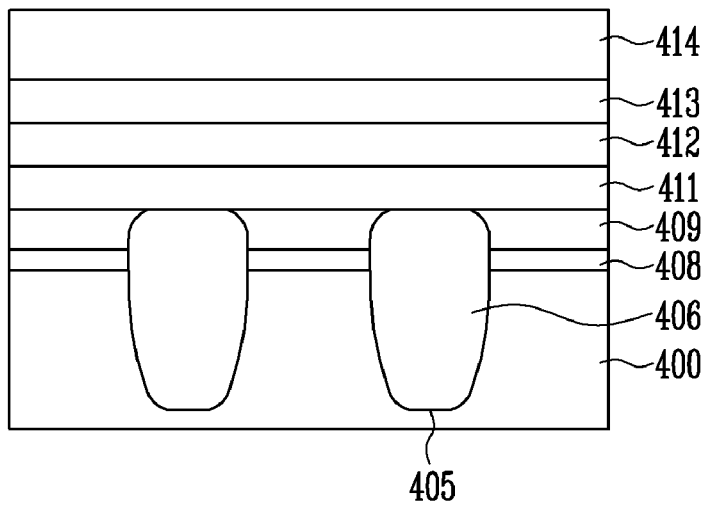

Referring to FIG. 4G, a blocking insulating layer 411, a metal layer 412, a first gate electrode layer 413 and a second gate electrode layer 414 are sequentially stacked over the entire surface including the isolation layers 406. A patterning process is then performed to thereby form a gate of a cell region. The blocking insulating layer 411 may be formed of $SiO_2$ (silicon oxide), $Al_2O_3$ (alumina) (i.e., a high-k material), $Ta_2O_5$ (tantalum oxide), $ZrO_3$ (zirconium oxide), $HfO_2$ (hafnium oxide), $La_2O_3$ (lanthanum oxide), $TiO_2$ (titanium oxide), $SrTiO_3$ (strontium oxide titanite oxide), a combination thereof, or oxide and ferroelectric material of the perovskite structure. The metal layer 412 may be formed of TiN, TiCN, TaN or TaCN. Each of the blocking insulating layer 411 and the metal layer 412 may be formed by a CVD (Chemical Vapor Deposition), PVD (Physical Vapor Deposition) or ALD (Atomic Layer Deposition) method. The first gate electrode layer 413 may be formed of polysilicon and the second gate electrode layer may be formed of WSix.

FIGS. 5A to 5E are sectional views illustrating a method of fabricating a nonvolatile memory device in accordance with a third embodiment of the present invention.

Figure 5A:
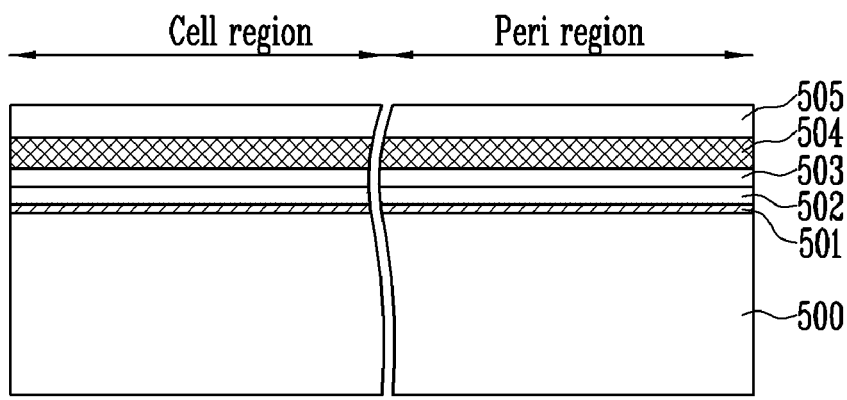
FIGS. 5A to 5E are sectional views illustrating a method of fabricating a nonvolatile memory device in accordance with a third embodiment of the present invention.

Referring to FIG. 5A, a first tunnel dielectric layer 501 and a charge trap layer 502 are sequentially formed over a semiconductor substrate 500. The first tunnel dielectric layer 501 may be formed of an oxide layer to a thickness of 10 to 500 angstroms using a radical oxidization method or a thermal oxidization method. The charge trap layer 502 may be formed of a nitride layer. The charge trap layer 502 may be formed by an ALD or CVD method. The charge trap layer 502 may be formed of a LP-nitride layer or PE-nitride layer to a thickness of 10 to 500 angstroms. The charge trap layer 502 may be formed of a mixed layer of an oxide layer and a nitride layer instead of the nitride layer. The charge trap layer 502 may also be formed of $HFO_2$, $ZrO_2$, HFAlO, HFSiO, ZrAlO or ZrSiO.

A blocking insulating layer 503 and a first conductive layer 504 are sequentially stacked, subsequently. The blocking insulating layer 503 may be formed of an oxide layer. The blocking insulating layer 503 may also be formed of hafnium oxide, aluminum oxide or zirconium oxide. Alternatively, the blocking insulating layer 503 may be formed of a nitride layer instead of the oxide layer. Alternatively, the blocking insulating layer 503 may have a dual structure of an oxide layer and a nitride layer. The blocking insulating layer 503 may be formed to a thickness of 10 to 500 angstroms. After the blocking insulating layer 503 is formed, a RTP (Rapid Thermal Processing) may be performed so as to improve the film quality of the blocking insulating layer 503.

The first conductive layer 504 may be formed of a polysilicon layer or a metal layer. The polysilicon layer may be formed of a polysilicon layer doped with an $N^+$ impurity. In this case, the ion doping concentration of the polysilicon layer may range from $1E19$ atoms/$cm^3$ to $5E20$ atoms/$cm^3$. A TaN layer can be used as the metal layer to form the first conductive layer 504.

Thereafter, to increase a possible number of traps of the charge trap layer 502, an ion implantation process is carried out. The ion implantation process is performed by implanting As or P as an impurity. A hard mask layer 505 is then formed on the first conductive layer 504.

Figure 5B:
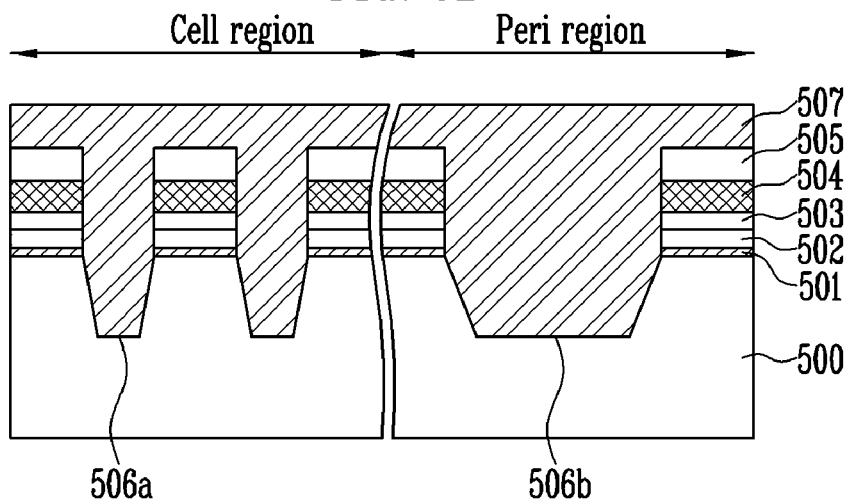

Referring to FIG. 5B, the semiconductor substrate 500 is exposed by sequentially etching the hard mask layer 505, the first conductive layer 504, the blocking insulating layer 503, the charge trap layer 502 and the first tunnel oxide layer 501 formed over an isolation region of a cell region (i.e., a memory cell region). The exposed semiconductor substrate 500 is etched to thereby form trenches 506a in the cell regions. In a similar way, a trench 506b is formed in an isolation region of a peri region (i.e., a peripheral region). The trench 506a of the cell region and the trench 506b of the peri region can be formed separately or simultaneously.

Insulating layers 507 for element isolation are formed over the entire surface including the trench 506a, 506b. The insulating layer 507 may be formed of an SOG, SOD or HDP oxide layer.

The formation process of the trench 506a of the cell region and the trench 506b of the peri region, and the formation process of the insulating layer 507 may be performed anterior to the formation of the first conductive layer 504 after the blocking insulating layer 503 is formed.

Figure 5C:
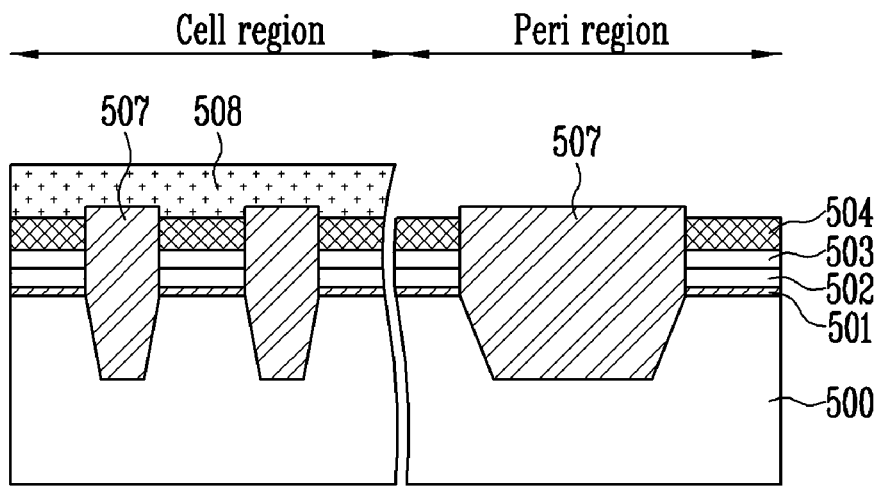

Referring to FIG. 5C, a polishing process is performed until the first conductive layer 504 is exposed. Preferably, a CMP process may be performed in order to form the isolation layers 507. In case that the formation process of the trench 506a of the cell region and the trench 506b of the peri region, and the formation process of the insulating layer 507 are performed after the blocking insulating layer 503 is formed without forming the first conductive layer 504, a polishing process is preferably performed until the blocking insulating layer 503 is exposed.

Thus, the charge trap layer 502 is electrically insulated from a neighboring charge trap layer 502 in a bit line direction by means of the isolation layer 507. It prevents trapped charges from moving to a neighboring cell.

A passivation dielectric layer 508 is formed over the entire surface including the isolation layers 507. The passivation dielectric layer 508 may be formed of a nitride layer. An etch process is then preformed to thereby remove the passivation dielectric layer 508 formed on the peri region.

Figure 5D:
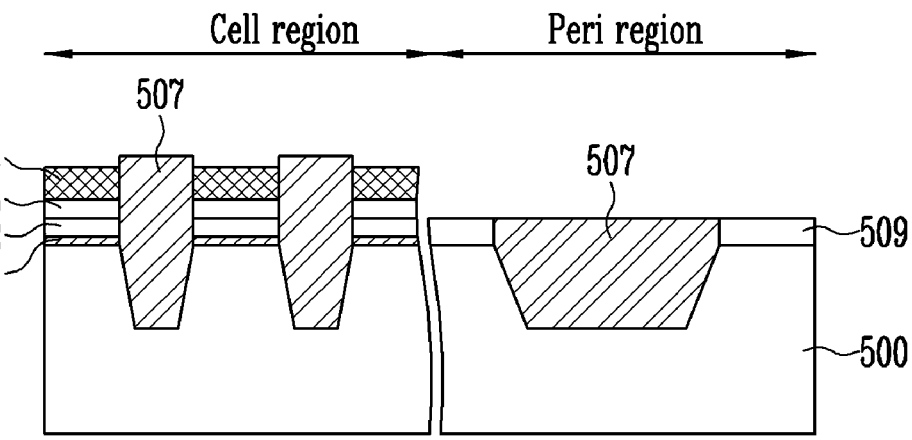

Referring to FIG. 5D, the semiconductor substrate 500 is exposed by sequentially etching the first conductive layer 504, the blocking insulating layer 503, the charge trap layer 502, and the first tunnel dielectric layer 501 exposed over the peri region. Here, the first tunnel dielectric layer 501 may not be removed and remain in order to form it into a second tunnel dielectric layer through control of its thickness in a subsequent oxidization process. Thereafter, a protruded top surface of the isolation layer 507 is etched so as to control the height of the isolation layer 507. An oxidization process is then performed to thereby form a second tunnel dielectric layer 509 on the exposed semiconductor substrate 500. The second tunnel dielectric layer 509 may be formed of an oxide layer. When a transistor to be formed in the peri region is a low voltage transistor, the second tunnel dielectric layer 509 may be formed to a thickness of 500 to 200 angstroms, and when the transistor to be formed in the peri region is a high voltage transistor, the second tunnel dielectric layer 509 may be formed to a thickness of 500 to 600 angstroms.

As described above, after the passivation dielectric layer 508 is formed in the cell region, the tunnel dielectric layer for a high voltage can be formed in the peri region. Accordingly, a high voltage transistor can be formed easily.

An etch process is then performed so as to remove the passivation dielectric layer 508 formed in the memory cell region.

Figure 5E:
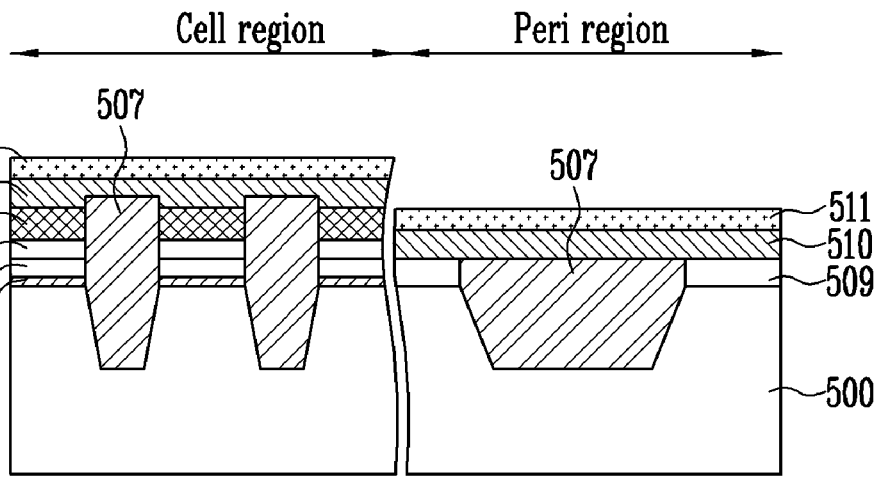

Referring to FIG. 5E, a second conductive layer 510 is formed over the entire surface including the first conductive layers 504 formed in the cell regions and the second tunnel dielectric layers 509 formed in the peri region. The second conductive layer 510 may be formed using the same material as the first conductive layer 504. To reduce resistivity of a gate electrode, a metal gate layer 511 is formed on the second conductive layer 510. The metal gate layer 511 may be formed of WSi or WN/WSi when the first conductive layer 504 and the second conductive layer 510 are formed of a polysilicon layer. Alternatively, the metal gate layer 511 may be formed of polysilicon/WN/WSi when the first conductive layer 504 and the second conductive layer 510 are formed of a metal layer.

It is to be understood that the above embodiments of the present invention may also be applied to TANOS (Tantalum/$Al_2O_3$/Nitride/Oxide/Silicon) type nonvolatile memory devices as well as the SONOS and MANOS type nonvolatile memory devices.

In accordance with the first embodiment of the present invention, the charge trap layer is formed in each memory cell by performing a patterning process on the charge trap layer. Charges stored in the charge trap layer can be prevented from diffusing into neighboring memory cells. Accordingly, it can reduce the occurrence of problems such as potential drop, a shift in the threshold voltage, and degradation of the data retention characteristic, etc., which are generated when charges stored in the charge trap layer move to neighboring memory cells.

In accordance with the second embodiment of the present invention, the charge trap layers are formed in the spaces between the isolation layers formed in the isolation regions of the semiconductor substrate. It can prevent charges, which are trapped in the charge trap layer, from moving to neighboring cell gates at the time of a program operation. Accordingly, the program threshold voltage and, thereby, the retention characteristic of a cell can be improved.

In accordance with the third embodiment of the present invention, the charge trap layer is formed over the semiconductor substrate before the isolation layers are formed by a subsequent process. The charge trap layer of a memory cell is electrically isolated from the charge trap layers of neighboring memory cells in the bit line direction by means of the isolation layers. It can prevent charges, which are trapped in the charge trap layer, from moving to neighboring cell gates at the time of a program operation. Accordingly, the program threshold voltage and, thereby, the retention characteristic of a cell can be improved. Further, after the passivation dielectric layer is formed in the cell region, the tunnel dielectric layer for a high voltage transistor or a low voltage transistor is formed in the peri region by controlling the thickness of the tunnel dielectric layer. Accordingly, a high voltage transistor or a low voltage transistor can be formed easily.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A method of fabricating a nonvolatile memory device, the method comprising:
   forming a first dielectric layer and a charge trap layer on a surface of a semiconductor substrate that includes protruded isolation layers;
   planarizing the charge trap layer and the first dielectric layer to expose a top surface of the protruded isolation layers, so that the first dielectric layer and the charge trap layer are formed on the semiconductor substrate of active regions;
   forming a second dielectric layer on the isolation layers and the charge trap layer; and
   forming a conductive layer on the second dielectric layer, wherein the formation of the protruded isolation layers in the semiconductor substrate includes:
      forming a pad nitride layer on the semiconductor substrate;
      forming first mask patterns on the pad nitride layer having open regions corresponding to the isolation layers;
      patterning the pad nitride layer using the first mask patterns and forming trenches in the semiconductor substrate; and
      filling the trenches with an insulating material to form the protruded isolation layers;
   wherein second mask patterns having open regions are formed on the charge trap layer when the charge trap layer and the first dielectric layer over the isolation layers are removed.

2. The method of claim 1, wherein the charge trap layer is formed of an insulating material.

3. The method of claim 1, wherein the charge trap layer is formed of a nitride layer.

4. The method of claim 1, wherein the first dielectric layer is a tunnel insulating layer and the second dielectric layer is a blocking layer and the conductive layer is a control gate.

5. A method of fabricating a nonvolatile memory device, the method comprising:
   forming an insulating layer and a hard mask pattern layer sequentially over a semiconductor substrate;
   forming trenches by etching the semiconductor using the hard mask pattern layer as an etch mask;
   filling the trenches with an insulating material to form isolation layers;
   removing the insulating layer and the hard mask layer, thereby forming protruded isolation layers;
   forming a tunnel dielectric layer, a charge trap layer and a buffer dielectric layer on the entire surface of the semiconductor substrate including the protruded isolation layers; and
   planarizing the buffer dielectric layer, the charge trap layer and the tunnel dielectric layer to expose a top surface of the protruded isolation layers, so that the tunnel insulating layer and the charge trap layer are formed on the semiconductor substrate of active regions wherein the active regions are defined by the protruded isolation layers.

6. The method of claim 5, further comprising:
   forming a passivation dielectric layer on the hard mask pattern layer and the isolation layers after the filling the trenches,
   wherein the passivation dielectric layer is removed during the step of removing the insulating layer and the hard mask pattern layer to form the protruded isolation layers.

7. The method of claim 6, wherein the passivation dielectric layer is formed of a nitride layer of 200 to 4000 angstroms in thickness using a LP-CVD or PE-CVD method.

8. The method of claim 5, further comprising;
   forming a blocking insulating layer, a metal layer and a gate electrode layer on the charge trap layer and the isolation layers, after the planarizing process.

9. The method of claim 8, further comprising:
   removing the buffer dielectric layer before forming the blocking insulating layer, the metal layer and the gate electrode layer.

10. The method of claim 5, wherein a protruding height of the isolation layer is in the range of 200 to 800 angstroms.

11. The method of claim 5, wherein the tunnel dielectric layer is formed by a thermal dry oxidization process, a thermal wet oxidization process or a radical oxidization process.

12. The method of claim 5, wherein a height of the charge trap layer is lower than that of a top surface of the protruded isolation layer.

13. The method of claim 5, wherein the charge trap layer is formed of stoichiometric silicon nitride or Si-rich nitride to a thickness of 40 to 200 angstroms by a LP-CVD or PE-CVD method.

14. The method of claim 5, wherein the buffer dielectric layer is formed of HDP (High Density Plasma) oxide, SOG (Spin On Glass), USG (Undoped Silicate Glass), PSG (PhosphoSilicate Glass) or BPSG (BoroPhosphoSilicate Glass) to a thickness of 500 to 4000 angstroms.

15. A method of fabricating a nonvolatile memory device, comprising:
    forming a tunnel dielectric layer and a charge trap layer on a semiconductor substrate in which a cell region and a peripheral region are defined;
    implanting an impurity into the charge trap layer by performing an ion implantation process;
    forming a blocking insulating layer and a first conductive layer on the charge trap layer;
    forming isolation trenches by etching the first conductive layer, the blocking insulating layer, the charge trap layer, the tunnel dielectric layer and the semiconductor substrate;
    forming a passivation dielectric layer on the first conductive layer of the cell region;
    filling the isolation trenches with an insulating material to form protruded isolation layers; and
    removing the first conductive layer, the blocking insulating layer and the charge trap layer of the peripheral region;
    etching the protruded top surface of the isolation layers formed in the peripheral region in order to control a height of the isolation layers of the peripheral region after removing the first conductive layer, the blocking insulating layer and the charge trap layer of the peripheral region;
    forming a gate insulating layer over the tunnel dielectric layer of the peripheral region; and
    removing the passivation dielectric layer.

16. The method of claim 15, further comprising;
    forming a conductive layer over the gate insulating layer of the peripheral regions and over the first conductive layer of the cell regions, after forming the gate insulating layer.

17. The method of claim 15, wherein the passivation dielectric layer is formed of a nitride layer.

18. The method of claim 15, wherein the gate insulating layer for a high voltage transistor is formed to a thickness of 500 to 600 angstroms, and the gate insulating layer for a low voltage transistor is formed to a thickness of 500 to 200 angstroms.

19. The method of claim 15, wherein the charge trap layer is formed of a nitride layer or a mixed layer of an oxide layer and a nitride layer.

20. The method of claim 15, further comprising:
    performing a RTP (Rapid Thermal Processing) in order to improve a film quality of the blocking insulating layer after the blocking insulating layer is formed.

21. The method of claim 15, further comprising, after the first conductive layer is formed, implanting an impurity into the charge trap layer by performing an ion implantation process before forming the isolation trenches.

22. The method of claim 21, wherein the ion implantation process is performed using As or P as the impurity.

* * * * *